United States Patent [19]
Funakubo et al.

[11] Patent Number: 5,345,137
[45] Date of Patent: Sep. 6, 1994

[54] TWO-DIMENSIONALLY DRIVING ULTRASONIC MOTOR

[75] Inventors: Tomoki Funakubo; Katsuhiro Wakabayashi, both of Tokyo, Japan

[73] Assignee: Olympus Optical Co., Ltd., Tokyo, Japan

[21] Appl. No.: 865,345

[22] Filed: Apr. 8, 1992

[30] Foreign Application Priority Data

| | | | |
|---|---|---|---|
| Apr. 8, 1991 | [JP] | Japan | 3-101772 |
| Nov. 19, 1991 | [JP] | Japan | 3-330155 |
| Dec. 20, 1991 | [JP] | Japan | 3-354941 |

[51] Int. Cl.$^5$ .................................. H01L 41/08
[52] U.S. Cl. ........................... 310/323; 310/328; 310/366
[58] Field of Search .............. 310/328, 323, 366, 359

[56] References Cited

U.S. PATENT DOCUMENTS

| | | | |
|---|---|---|---|
| 4,764,702 | 8/1988 | Mishiro | 310/323 |
| 4,794,294 | 12/1988 | Shimizu et al. | 310/323 |
| 4,812,697 | 3/1989 | Mishiro | 310/323 |
| 4,893,045 | 1/1990 | Honda | 310/323 |
| 4,958,100 | 9/1990 | Crawley et al. | 310/328 |
| 5,081,391 | 1/1992 | Owen | 310/328 |
| 5,122,700 | 6/1992 | Tamai et al. | 310/323 |

FOREIGN PATENT DOCUMENTS

| | | | |
|---|---|---|---|
| 58-148682 | 4/1983 | Japan . | |
| 61-15572 | 2/1986 | Japan . | |
| 61-52167 | 2/1986 | Japan . | |
| 0170082 | 7/1986 | Japan | 310/366 |
| 0023380 | 1/1987 | Japan | 310/323 |
| 62-141980 | 5/1987 | Japan . | |
| 0209877 | 9/1987 | Japan | 310/328 |
| 62-264543 | 9/1987 | Japan . | |
| 62-135278 | 11/1987 | Japan . | |
| 63-141380 | 2/1988 | Japan . | |
| 1-315269 | 2/1989 | Japan . | |
| 2-7875 | 3/1990 | Japan . | |

*Primary Examiner*—Thomas M. Dougherty
*Attorney, Agent, or Firm*—Louis Weinstein

[57] ABSTRACT

This two-dimensional driving ultrasonic motor comprises a first electro-mechanical energy converting device consisting of an ultrasonic vibrator having a unidirectional polarizing process applied to the entire surface; a second electro-mechanical energy converting device consisting of an ultrasonic vibrator laminated on this first electro-mechanical energy converting device and having a reversely directed polarizing process applied with a central line segment serving as a boundary between the oppositely polarized areas; a third electro-mechanical energy converting device consisting of an ultrasonic vibrator laminated on the first and second electro-mechanical energy converting devices and having a reversely directed polarizing process applied with a line segment serving as a boundary between the oppositely polarized areas, the second and third devices being aligned so that the line segments intersect at right angles; a friction member fixed to the lamination end of the laminated electro-mechanical energy converting devices; and a driven member pressed against this friction member under a predetermined pressure.

20 Claims, 20 Drawing Sheets

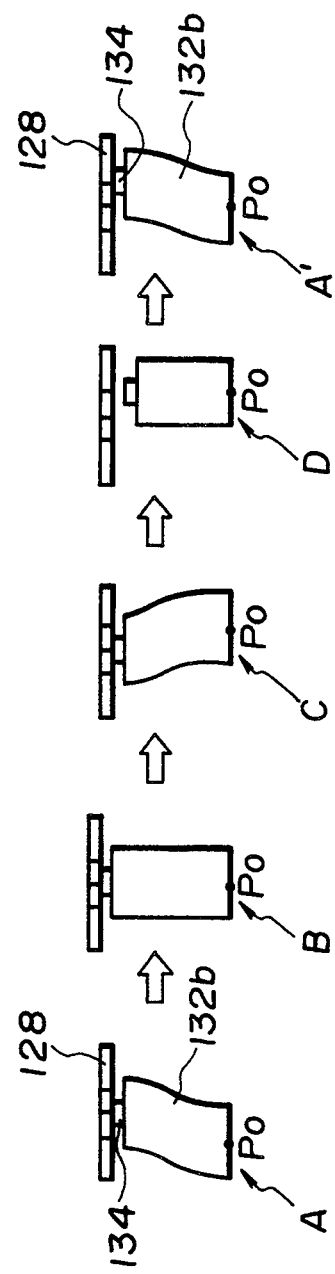

TWO-DIMENSIONALLY DRIVING ULTRASONIC MOTOR

BACKGROUND OF THE INVENTION

1. Field of the Invention

This invention relates to ultrasonic motors and more particularly to a two-dimensionally driving ultrasonic motor using as a vibration source such electro-mechanical converting device as a piezo-electric device.

2. Related Background Art

Recently, in such drive source as of an analyzing apparatus, semiconductor related apparatus or optical apparatus is required a three-dimensional direction positioning of high precision and speed. As a required of high speed and high precision actuator. Such so-called electro-mechanical energy converting device as a piezo-electric device or electro-striction device is noted today.

Now, as a two-dimensionally positioning and moving apparatus is recently noted a so-called ultrasonic motor which is superior to the conventionally used electro-magnetic motor in the following points:

(1) It is small in size, light in weight and low in power consumption;
(2) A low speed and high torque are obtained without needs for a reduction gear;
(3) The number of parts is low, assembly is easy and the reliability is high;
(4) No magnetic influence is given or received; and
(5) There is no backlash and positioning is easy.

Thus, various techniques are being studied and developed to utilize these advantages.

Generally, ultrasonic motors can be largely divided into a rotary driving type and linear driving type.

Now, there is suggested such linear driving type ultrasonic motor as is mentioned, for example, in Japanese patent application laid open No. 7875/1990.

This linear driving type ultrasonic motor comprises two pairs of piezo-electric devices, a laminated piezo-electric member made by laminating many plate-like piezo-electric devices and an upper stand and lower stand made respectively of metals or the like bonded respectively to the upper surface and lower surface of the piezo-electric member. The two pairs of piezo-electric devices are bonded through an insulating member so that either pair may be the same in the direction of the polarization. The two pairs of piezo-electric devices and the laminated piezo-electric member are connected to respective independent driving voltage applying lead wires.

The ultrasonic motor of the above mentioned formation vibrates the laminated piezo-electric member and the piezo-electric devices fitted to the member so that, by the synthesized vibration in the horizontal and vertical directions generated thereby, the mass point on the vibrator may make an elliptic vibration of any size and manner. Therefore, when a driven member is contacted with the upper surface of the vibrator, the driven member will be driven two-dimensionally.

In the ultrasonic motor mentioned in the above mentioned publication of Japanese patent application laid open No. 7875/1990, there are defects that, as a vibration in the horizontal direction is generated in the vibrator by the two pairs of piezo-electric devices, a high driving voltage will be required and the amplitude of the horizontal vibration will not be able to be made so large.

Further, as of an ultrasonic motor actuator, there are suggested the publications of Japanese patent application laid open Nos. 15572/1986, 141980/1987, 264543/1987 and 315269/1989.

However, the conventional technique disclosed in the above mentioned publication of Japanese patent application laid open No. 15572/1986 has problems that the resonant frequency of the bending vibration of the vertically rising part of the elastic body and the resonant frequency of the bending vibration of the horizontal part of the elastic body will have to be made to coincide with each other, the dimensions will have to be changed by trial errors, a trial make will have to be repeated, much labor will be required and the shape will be T and will have to be large.

Also, the conventional technique disclosed in the above mentioned publication of Japanese patent application laid open No. 141980/1987 has problems that, in the ultrasonic vibrator, in order that the resonant frequency of the bending and the resonant frequency of the extension and contraction may be made to coincide with each other, the dimensions will have to be changed by trial errors, a trial make will have to be repeated and much labor will be required and, the same as in the one in the above mentioned publication of Japanese patent application laid open No. 15572/1986, in case an ultrasonic elliptic vibration is generated by combining a different mode (resonant mode), by the variation of the size of the pressing contact force of the driven body held in contact there and the temperature rise of the vibrator, the resonant frequencies of both modes will be delayed to be different and the practice will be difficult.

Further, the conventional technique disclosed in the above mentioned publication of Japanese patent application laid open No. 264543/1987 has problems that the moving element is a cylindrical body consisting of a piezo-electric device and the applied voltage will have to be large, in case the bending vibration of the moving element is used by the resonant vibration, as the cylindrical body is a hollow cylinder, the number of the vibrations will enter an audible region and noises will be generated and, further, in order to elevate the driving capacity, in case the bending vibration and extending and contracting vibration are both used in the resonant frequency, the frequencies will have to be made to coincide with each other the same as in the ones in the above mentioned publications of Japanese patent application laid open Nos. 15572/1986 and 141980/1987.

Also, the conventional technique disclosed in the publication of Japanese patent application laid open No. 315269/1989 has a problem that, as a sliding vibrator is used for the piezo-electric body of the vibrator and is used in non-resonance, a large voltage will have to be applied to obtain a vibration amplitude.

OBJECTS AND SUMMARY OF THE INVENTION

A first object of the present invention is to provide a two-dimensionally driving ultrasonic vibrator which is compact, is high in energy converting efficiency, can output a large vibration output and is easy to make and an ultrasonic motor having the same vibrator.

A second object of the present invention is to provide a two-dimensionally driving ultrasonic vibrator which is compact, is high in energy converting efficiency, can output a large vibration output, will be able to reversibly move a driven body in case it is used as a linear motor, is little restricted in the design and is easy to make.

Briefly, this invention comprises:

an ultrasonic motor characterized by comprising a first electro-mechanical energy converting device which is an ultrasonic vibrator having a unidirectional polarizing process applied to the entire surface, a second electro-mechanical energy converting device which is an ultrasonic vibrator laminated on said first electro-mechanical energy converting device and having a reversely directed polarizing process applied with a central line segment as a boundary, a third electro-mechanical energy converting device which is an ultrasonic vibrator laminated on the above mentioned first and second electro-mechanical energy converting devices and having a reversely directed polarizing process applied with a line segment in the direction intersecting at right angles with the above mentioned line segment as a boundary, a friction member fixed to the lamination end of the above mentioned laminated electro-mechanical energy converting device and a driven member pressed with a predetermined pressure against this friction member; and an ultrasonic motor characterized by comprising a first electro-mechanical energy converting device which is an ultrasonic vibrator having a unidirectional polarizing process applied to the entire surface and having electrodes on the entire regions of both surfaces, a second electro-mechanical energy converting device which is an ultrasonic vibrator laminated on this first electro-mechanical energy converting device, having a unidirectional polarizing process applied to the entire surface and having an electrode on substantially the entire region of one surface and a divided electrode on the other surface, a third electro-mechanical energy converting device which is an ultrasonic vibrator laminated on the above mentioned first and second electro-mechanical energy converting devices, having a unidirectional polarizing process applied to the entire surface and having an electrode on substantially all of the region of one surface and the divided electrode in the above mentioned second electro-mechanical energy converting device as divided in the direction intersecting at right angles on the other surface, a friction member fixed to the lamination end of the above mentioned laminated electro-mechanical energy converting device and a driven member pressed with a predetermined pressure against said friction member.

According to the present invention, there can be provided an ultrasonic vibrator which integrates a member performing a bending vibration and a member performing a vertical vibration together, therefore is easy to make, is compact and is high in energy converting efficiency. Also, by using such ultrasonic vibrator, there can be provided a compact linear motor and such driving apparatus as a two-dimensional moving stage.

The ultrasonic vibrator can drive a driven member linearly or two-dimensionally and with a low driving voltage below 10 volts. Also, the ultrasonic vibrator of the present invention can be used as a scanner of an STM (scanning tunneling microscope) probe, is compact and can be driven at a high efficiency.

Also, if one to three-dimensional minute positioning is made with a laminated vibrating device having a divided electrode of the present invention, a minute movement controlling apparatus which is low in voltage and displacement, can take a generated force to be large, is compact and is easy to assemble will be able to be made. The lamination itself can be easily made by an integrally calcining method wherein green sheets are printed with internal electrodes, laminated, cut and then calcined and a bonding method wherein ceramics plates are laminated and bonded and is therefore very wide in the utilization range. Further, the vibrating device can generate an elliptic vibration on the end surface and can be utilized as a device driving a moving body horizontally and two-dimensionally. By the way, the one using a laminated electro-striction device instead of the laminated piezo-electric device shows the same effect. Also, there can be made an ultrasonic vibrating device which can be driven with such low voltage as several volts V to several scores of volts V, is small in the power consumption, is compact and can output a large vibration output. In case the ultrasonic vibrating device is used as a linear motor, there will be able to be provided an ultrasonic vibrator which can two-dimensionally move an object to be driven, is little restricted in the design and is easy to make and a driving apparatus having this vibrator. Further, this vibrator can be used as a card reader motor.

These and other objects and advantages of this invention will become more apparent from the following detailed explanation.

BRIEF DESCRIPTION OF THE DRAWINGS

- FIG. 3 is a side view of its bending vibrating state. FIG. 5 and 6 are its plan views. FIG. 4 is a side view of its vertical vibrating state.

FIG. 41 is an elevation showing the vibrator in FIG. 38 as a slider is moved.

DETAILED DESCRIPTION OF THE PREFERRED EMBODIMENTS

Figure 1:
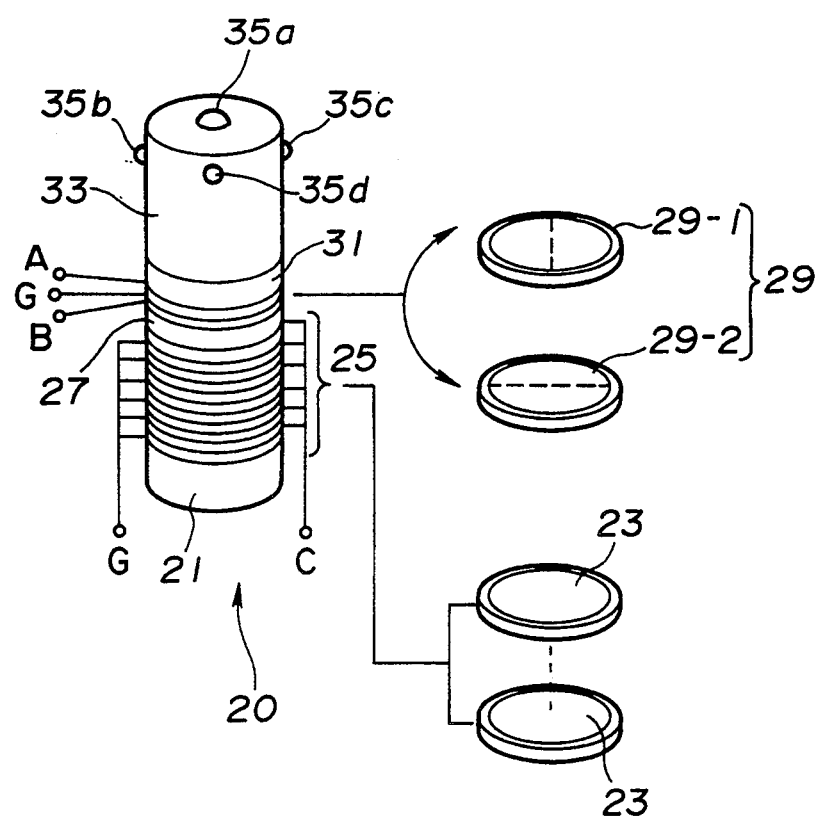
FIG. 1 is a perspective view showing a first embodiment of an ultrasonic vibrator used for an ultrasonic motor of the present invention.
Figure 2:
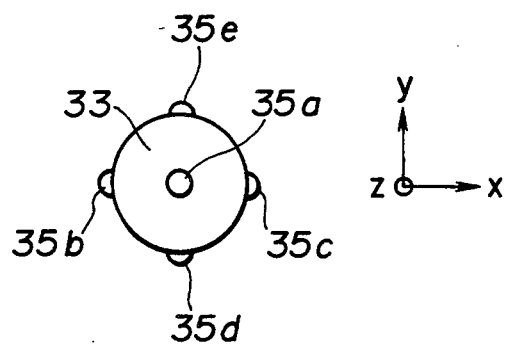
FIG. 2 is a plan view of the ultrasonic vibrator in FIG. 1.

FIG. 1 is a perspective view showing the formation of the first embodiment of an ultrasonic vibrator 20. FIG. 2 is a plan view of the same. A columnarly formed lower elastic body 21 is formed of such metallic material as stainless steel, aluminum or duralumin. A lamination of several to several scores of piezo-electric devices 23 of thin disc-like PZT's or the like is bonded to the upper surface of this lower elastic body 21 with an epoxy type bonding agent. In FIG. 1, two of the piezo-electric devices 23 are typically taken out. These piezo-electric devices are respectively uniformly polarized to be vertical to the surface, have such electrode process as silver baking applied to both surfaces and are laminated so that the polarizing direction may be reversed in each device. The thus laminated lamination shall be called a vertical vibration lamination 25 hereinafter. In the respective piezo-electric devices 23, each electrode is wired to every other device so as to form a grounding terminal (G terminal) on one side and a voltage input terminal (C terminal) on the other side.

A disc-like lower insulator 27 formed of such insulating ceramics material as alumina is bonded and fixed to the upper surface of the vertical vibration lamination 25. Piezo-electric devices 29-1 and 29-2 are laminated on the upper surface of this lower insulator 27. In the drawing, these two devices are taken out so as to be understandable. These piezo-electric devices 29-1 and 29-2 are polarized respectively so as to be in the direction vertical to the surface and to be reverse on each half of the surface. Each piezo-electric device has such electrode process as silver baking applied to both entire surfaces. The lamination of these two devices shall be called a bending vibration lamination 29 hereinafter. The piezo-electric devices 29-1 and 29-2 are laminated so that the respective polarizing boundary lines shown by dotted lines may intersect at right angles with each other. In this case, the polarizing boundary direction of the piezo-electric device 29-2 shall be an x axis direction, the polarizing boundary direction of the piezo-electric device 29-1 shall be a y axis direction and the direction intersecting at right angles with these axes shall be a z axis direction. Electric terminals A, G and B are taken respectively out of the upper surface, bonding surface and lower surface of this bending vibration lamination 29 (the terminal G is a grounding terminal).

Figure 9:
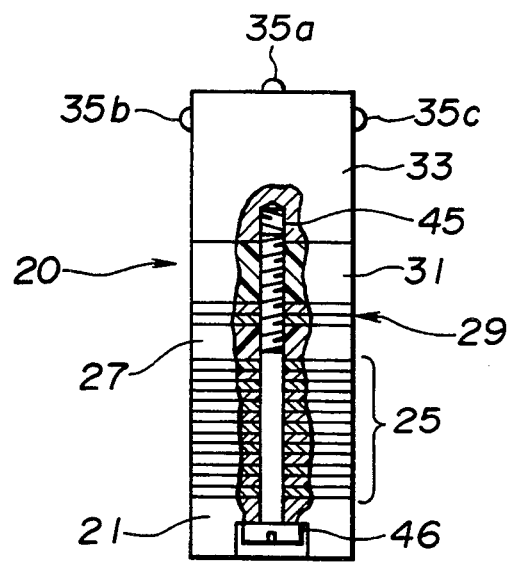
FIG. 9 is a side view showing a modification of the ultrasonic vibrator of FIG. 1.

A columnar upper insulator 31 formed of such insulating ceramics material as alumina is bonded and fixed to the upper surface of this bending vibration lamination 29. A columnar upper elastic body 33 formed of such metallic material as stainless steel, aluminum or duralumin is bonded and fixed to the upper surface of the upper insulator 31. Hemispheric projections 35a to 35e which are friction members are formed in the central part on the upper surface of the upper elastic body 33, two places in the x axis direction on the peripheral side surface and two places in the y axis direction as understood from FIGS. 1 and 2. By the way, in the above explanation, the respective members are bonded with such bonding agent as epoxy resin. Alternatively, as shown in FIG. 9, a through hole is made in the center part of the ultrasonic vibrator 20, a screw hole 45 is formed in the upper elastic body 33 and a screw 46 may be fitted from the bottom surface of the lower elastic body 21 to press and fix the respective members.

The operation of this embodiment shall be explained in the following with reference to FIGS. 1 to 6. By the way, in FIGS. 3 to 6, the vertical vibration lamination 25 and bending vibration lamination 29 of the ultrasonic vibrator 20 in FIG. 1 are omitted and only the projection 35a of the friction member is illustrated.

For example, the lower elastic body 21 as fixed on the lower surface to a base not illustrated shall be explained. When an alternating voltage of a frequency corresponding to a one-dimensional bending resonant vibration is applied to the terminal A in FIG. 1 by a power source not illustrated, the above mentioned ultrasonic vibrator 20 will make such bending vibration as in FIG. 3 within a plane x-z. Therefore, the projection 35a formed on the upper surface will make a vibration in the x axis direction as in FIG. 5. On the other hand, when an alternating voltage of the same frequency is applied to the terminal C by a power source not illustrated, the ultrasonic vibrator 20 will make a non-resonant vertical vibration as shown in FIG. 4. When these vibrations are made as delayed in phase by +90° or −90°, the projections 35a, 35b and 35c will make a clockwise or counterclockwise ultrasonic elliptic motion within the plane x-z. Thus, when a slider which is a driven member not illustrated is slidably contacted respectively with these projections 35a, 35b and 35c, the slider will be able to be slid by the ultrasonic elliptic motion of the projections.

Figure 3:
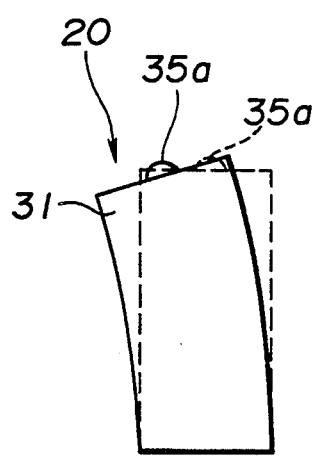
FIGS. 3 to 6 show the ultrasonic vibrator in FIG. 1 as making a bending vibration and vertical vibration
Figure 4:
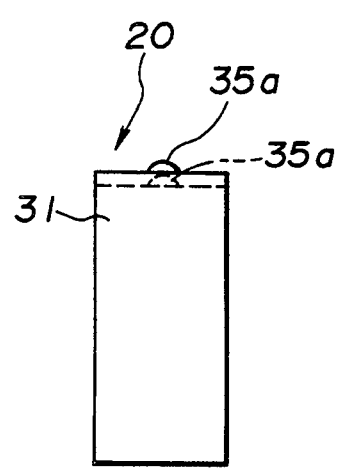
Figure 5:
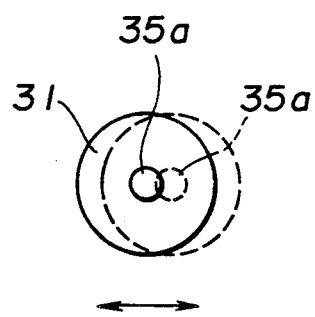
Figure 6:
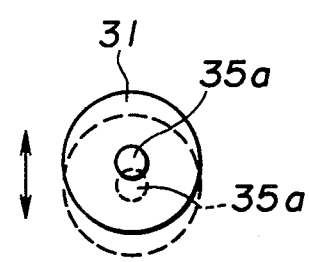

When an alternating voltage of a frequency corresponding to a one-dimensional bending resonant vibration is then applied to the terminal B in FIG. 1 by a power source not illustrated, the above mentioned ultrasonic vibrator 20 will make such bending vibration as in FIG. 3 in the plane y-z. Therefore, the projection 35a formed on the upper surface will make a vibration in the y axis direction as in FIG. 6. On the other hand, when an alternating current voltage of the same frequency is applied to the terminal C by a power source not illustrated, the ultrasonic vibrator 20 will make such non-resonant vertical vibration as is shown in FIG. 4. When these vibrations are made as delayed in the phase by +90° or −90°, the projections 35a, 35d and 35e of the friction members will make a clockwise or counter-clockwise ultrasonic elliptic motion within the plane y-z. Thus, when a slider of a driven member not illustrated is slidably contacted respectively with these projections 35a, 35d and 35e, the slider will be able to be slid by the ultrasonic elliptic motion of the projections.

Next, the two-dimensional drive shall be explained. In case, in the terminals A and B, the same bending resonant frequency is made in the same phase or such alternating voltage as is delayed in phase by 180° is simultaneously applied, when the size of the vibration amplitude is properly adjusted, the projection 35a will be able to make a linear reciprocating motion of any size in any direction within the plane x-y. On the other hand, simultaneously with it, when an alternating voltage of the same frequency is applied to the terminal C to generate a vertical vibration with a fixed phase difference (of +90° or −90°), the projection 35a will be able to generate an ultrasonic elliptic vibration within any plane including the z axis. At this time, if the planar slider which is a driven member is slidably contacted with the projection is a 35a which friction member, this slider will be movable in any direction within the plane x-y.

Figure 7:
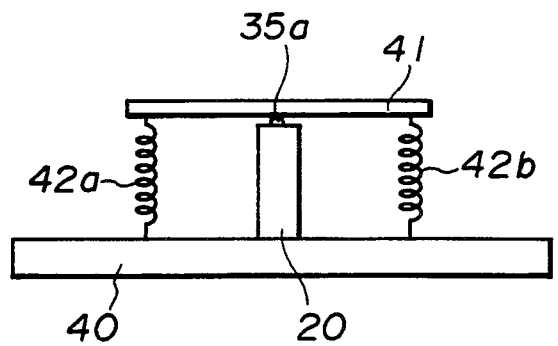
FIG. 7 is a side view of an ultrasonic motor driving an X-Y stage by using the ultrasonic vibrator of FIG. 1.
Figure 8:
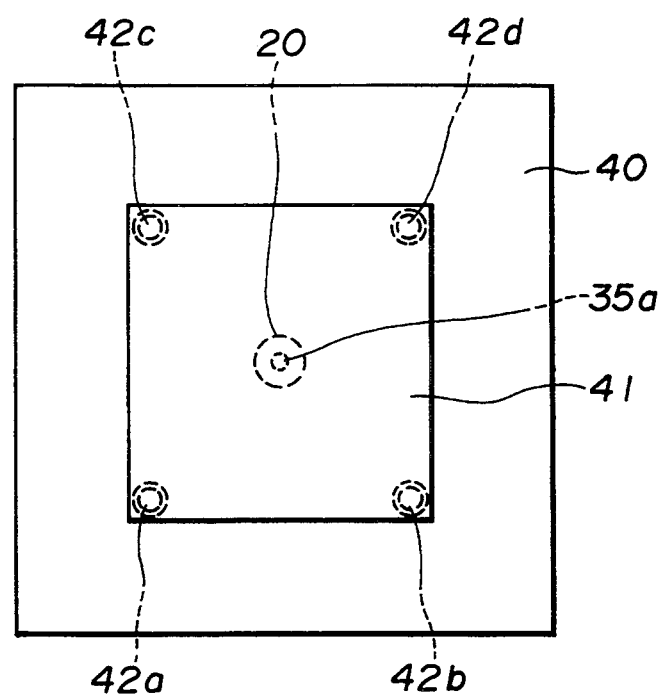
FIG. 8 is a plan view of the ultrasonic motor of FIG. 7.

An example of a stage x-y using this principle is shown in FIGS. 7 and 8. FIG. 7 is a side view and FIG. 8 is a plan view of the same. The above described ultrasonic vibrator 20 is secured with a bonding agent or the like in the central part on the upper surface of a base 40 made of stainless steel or the like. Also, four springs 42a to 42d are erected in four places equi-distant from the central part on the upper surface of the base 40. A stage 41 which is a driven member is fixed to these springs 42a to 42d so as to be opposed to the base 40 and to contact with the projection 35a which is a friction member of the ultrasonic vibrator 20. This stage 41 is formed of stainless steel, aluminum or aluminum oxidized on the surface and is supported by the springs 42a to 42d in the four corners so as to be in contact with the projection 35a under an integral pressing force by the energizing force of these springs.

In such formation, when this vibrator 20 is made to generate an ultrasonic elliptic vibration by a power source not illustrated, the projection 35a will make an ultrasonic elliptic motion so that the stage 41 may move in any direction within the plane x-y.

On the basis of the same idea, when the bending resonant vibration by the bending vibration lamination 29 and the non-resonant vertical vibration by the vertical vibration lamination 25 are synthesized together, any of the other projections 35b to 35e will be able to generate the same ultrasonic elliptic motion and such two-dimensional drive of the slider as is described above will be possible by using any projection. Thus, as the laminated piezo-electric devices are used as a main body of a vibration source, an essentially large mechanical output can be taken out and, even if the frequency of the driving power source is not made to coincide with the natural vibration number of the elastic body as in the past, a large mechanical output will be taken out. Therefore, as one vibration (vertical vibration) is driven in non-resonance, the restriction in the design will be little and the manufacture will be easy.

Figure 10:
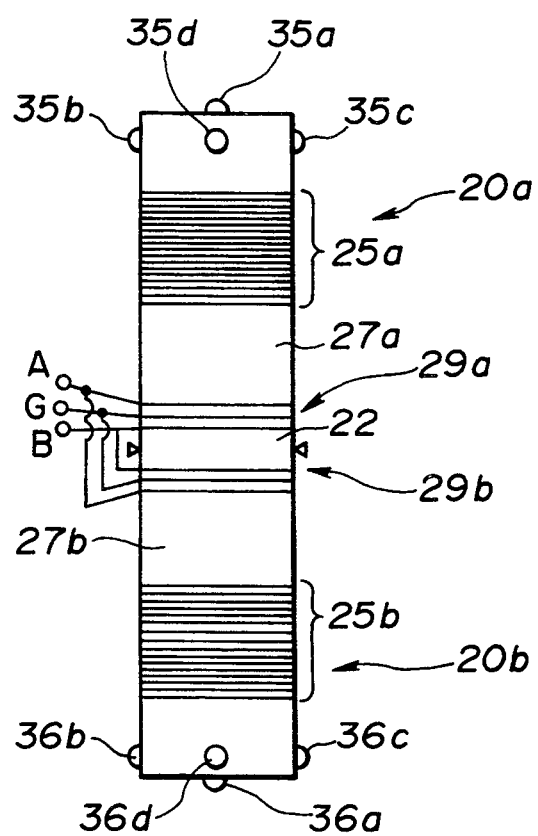
FIG. 10 is a side view showing a second embodiment of an ultrasonic vibrator used for an ultrasonic motor of the present invention.

FIG. 10 is a view for explaining the second embodiment. By the way, in the following embodiments, the same parts as in the first embodiment shall bear the same reference numerals and their explanation shall be omitted or simplified. In this embodiment, two (ultrasonic vibrators 20a and 20b) ultrasonic vibrators 20 explained in the first embodiment are connected in series. However, the arrangement of the vertical vibration lamination and bending vibration lamination in the respective ultrasonic vibrators 20a and 20b is different from and is reversed relative to that in the first embodiment. The ultrasonic vibrators 20a and 20b are bonded together with such bonding agent as, for example, epoxy resin with a central elastic body 22 held between them. In FIG. 10, the terminals pulled out of the vertical vibration laminations 25a and 25b are omitted.

In the above described embodiment, the bending vibration of the columnar bar is obtained by resonance and the vertical vibration is excited by non-resonance. However, if the shape and dimensions are properly taken, the vertical vibration will be also able to be driven by resonance. Further, both the bending vibration and vertical vibration can be driven by non-resonance. Further, the number of the laminated devices need not be as described in the embodiment but should be properly selected in response to the outputs of the vibrator and motor.

Figure 11:
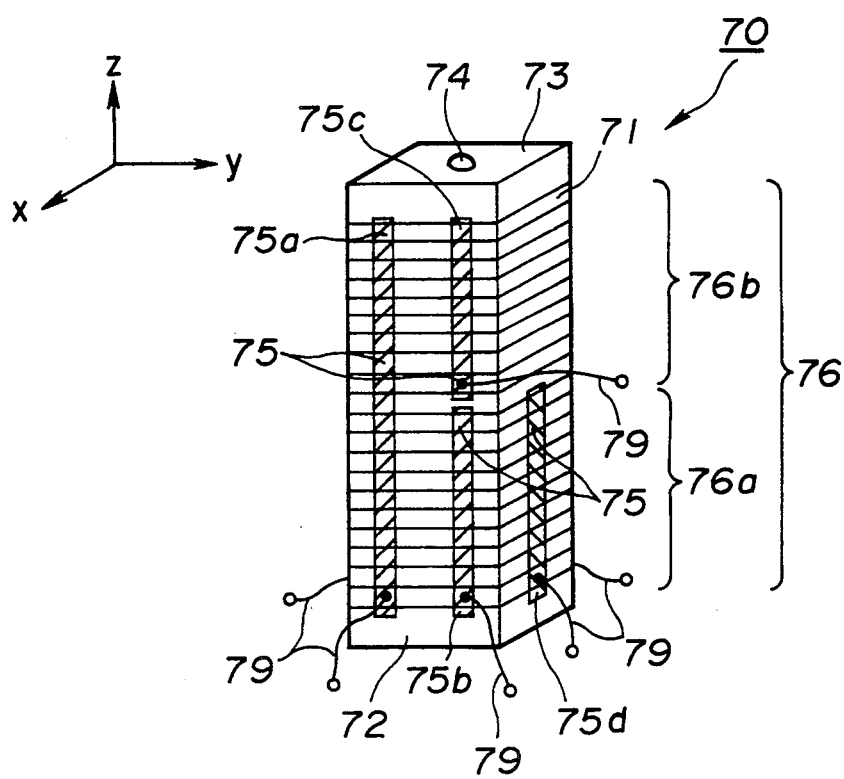
FIG. 11 is a perspective view showing a third embodiment of an ultrasonic vibrator used for an ultrasonic motor of the present invention.

FIGS. 11 to 19 show the third embodiment of the present invention. As shown in FIG. 11, an ultrasonic vibrator 70 has a lamination 76 in which a lower first lamination 76a and upper second lamination 76b are bonded in series. A driven body (not illustrated) is to be contacted with the upper end part of the second lamination 76b. A projecting stand 73 having a projection 74 in the center of the upper surface is provided in the upper end part of this second lamination 76b. On the other hand, a fixing stand 72 consisting of an insulator device is provided in the lower end part of the first lamination 76a.

Figure 13:
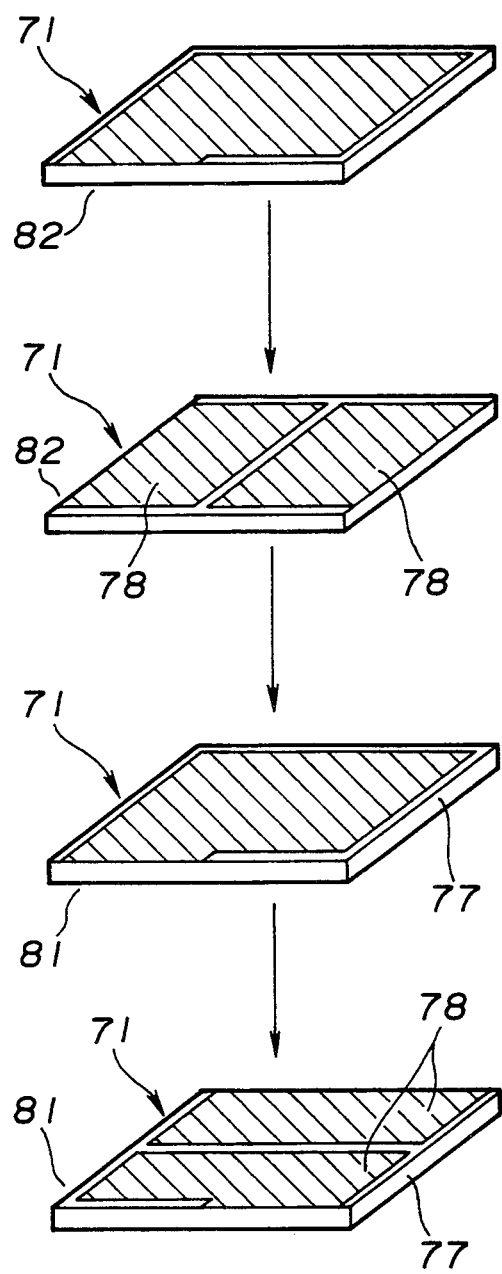
FIG. 13 is a disassembled perspective view of the first lamination as seen from above of the vibrator of FIG. 11.
Figure 14:
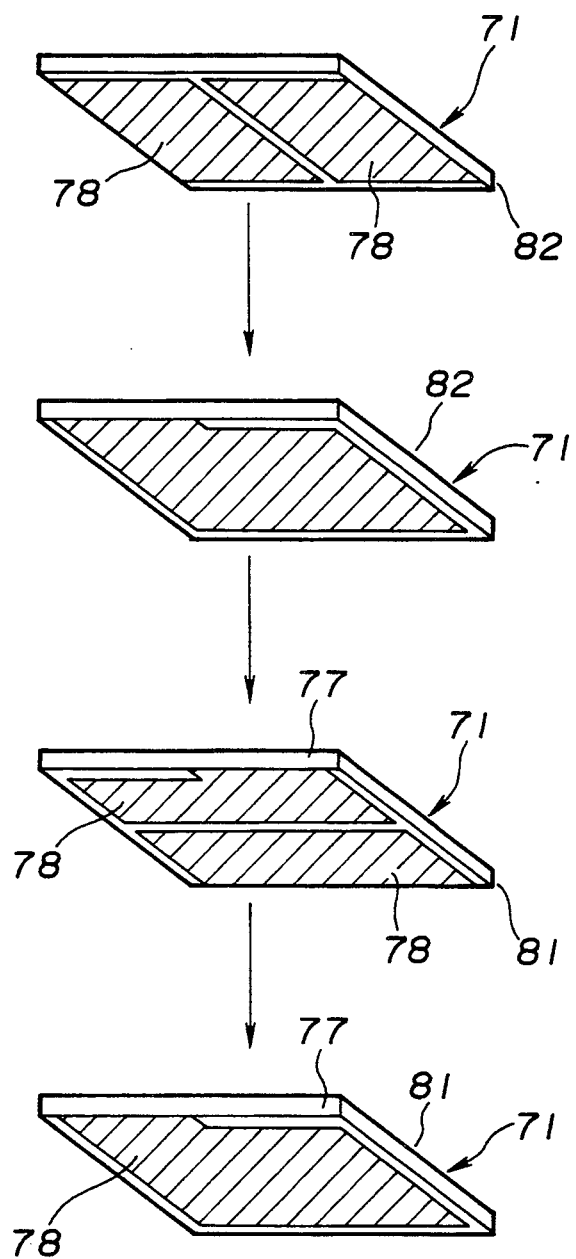
FIG. 14 is a disassembled perspective view of the first lamination as seen from below in FIG. 13.

Each of the first and second laminations 76a and 76b is formed by laminating a plurality of piezo-electric devices 71. FIG. 13 is a disassembled perspective view of the first lamination 76a as seen from above. FIG. 14 is a disassembled perspective view as seen from below. A rectangular PZT-PMN type material is used for the piezo-electric device 71. A calcined powder of this material and a binder are mixed together to make a slurry and this slurry is cast in a thickness of 100 μm on a film by a doctor blade method to make a green sheet. This green sheet is fitted and inserted and is then peeled off the film to be a piezo-electric film 77. Then, an internal electrode 78 is formed of an Ag-Pb paste or the like on both surfaces of the piezo-electric material 77 to make the piezo-electric device 71.

On the piezo-electric device 71 in the lowest step in FIGS. 13 and 14 in which the internal electrode 78 on the upper surface is divided into two parts in the right-left direction, the piezo-electric device 71 of the second step is laminated on the divided surface of this internal electrode 78. The piezo-electric device 71 of the second step in which, as shown in FIG. 14, the internal electrode 78 is divided into two parts in the right-left direction is laminated so that the divided surface of this inner electrode 78 and the divided surface of the piezo-electric device 71 of the lowest step may be opposed to each other to form a first laminated body 81. On the piezo-electric device 71 of the third step which is to be laminated on the piezo-electric device 71 of the second step and in which, as shown in FIG. 13, the inner electrode 78 on the upper surface is divided into two parts in the front-rear direction, the piezo-electric device 71 of the fourth step in which the inner electrode 78 on the lower surface is divided in the same direction is laminated to form a second laminated body 82. Therefore, in the first and second laminated bodies 81 and 82, the inner electrode dividing directions intersect at right angles with each other. The first laminated body 81 and second laminated body 82 are alternately laminated a plurality of times (for example, several scores of times) to form the first lamination 76a.

Figure 15:
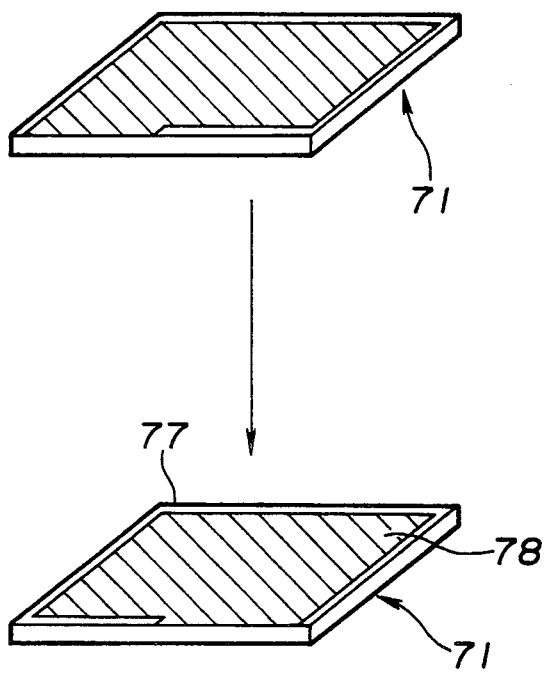
FIG. 15 is a disassembled perspective view of the second lamination as seen from above of the vibrator in FIG. 11.
Figure 16:
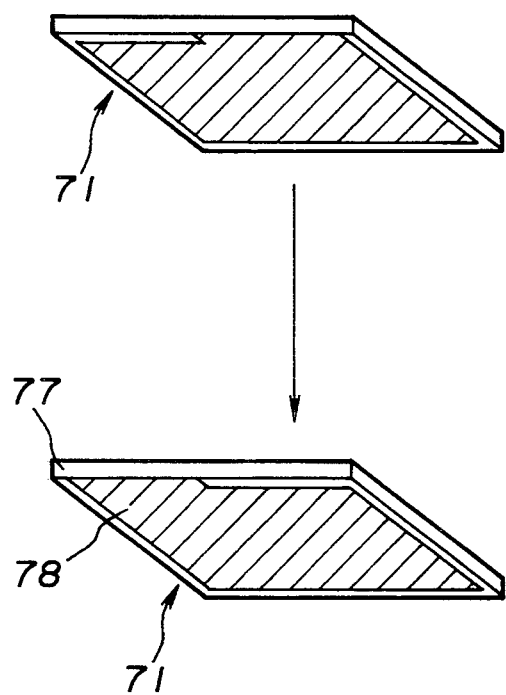
FIG. 16 is a disassembled perspective view of the second lamination as seen from below in FIG. 15.

FIGS. 15 and 16 are disassembled perspective views of the second lamination 76b as seen from above and below. The piezo-electric device 71 of this second lamination 76b is made by the same method as of the piezo-electric device 71 of the first lamination 76a but the inner electrode 78 of the picture is not divided and is formed substantially on all of the surface area of device 71. A plurality (several scores) of the piezo-electric devices 71 are laminated to form the second lamination 76b. These laminations 76a and 76b are laminated in series to form the lamination 76 which is hot-pressed and is sintered at about 1200°.

After being sintered, the lamination 76 is ground on the upper and lower end surfaces and has a fixing stand 72 made of ceramics or a metal and a projecting stand 73 made of ceramics or a metal fixed respectively to the lower end surface and upper end surface by bonding. In this case, the fixing stand 72 and projecting stand 73 may be integrally fired simultaneously with the firing of the lamination 76.

Figure 12:
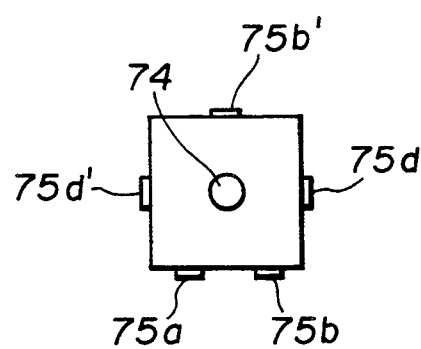
FIG. 12 is a plan view of the vibrator of FIG. 11.

After the lamination 76 is formed as described above, an outer electrode 75 is formed on the outside surface of the lamination 76. This outer electrode 75 can be also formed by applying such conductive paste as a silver paste. In FIGS. 11 and 12, the reference numeral 75a represents a gland outer electrode formed over the entire length of the lamination 76, 75b (opposed two surfaces) and 75d (opposed two surfaces) represent bending vibration outer electrodes formed over the entire lengths of the four surfaces of the first lamination 76a and 75c represents an extending and contracting vibration outer electrode formed over the entire length of the second lamination 76b. Lead wires 79 are connected to these outer electrodes 75a, 75b, 75d and 75c. By the way, such ultrasonic vibrator 70 is coated on the outer surface with an insulating protective film (not illustrated) to prevent the insulation from being destroyed.

The ultrasonic vibrator 70 made as in the above has a polarizing process applied in oil or air. That is to say, the bending vibration outer electrode 75b positioned on the opposed surface of the laminator 76 has a voltage applied so that the polarity may be reverse that of the gland outer electrode 75a. On the other hand, the extending and contracting vibration outer electrode 75c is processed to be polarized by applying a voltage of a positive or negative polarity to the gland outer electrode 75a.

Figure 17:
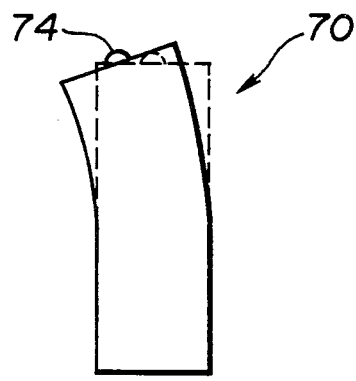
FIGS. 17 to 19 are side views respectively showing the vibration characteristics of the ultrasonic vibrator in FIG. 11.
Figure 18:
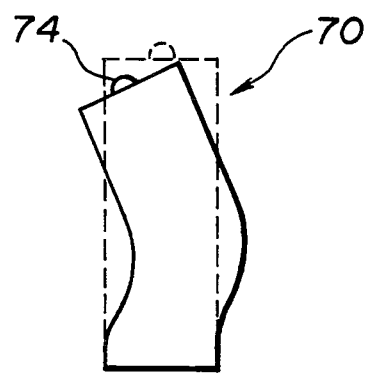
Figure 19:
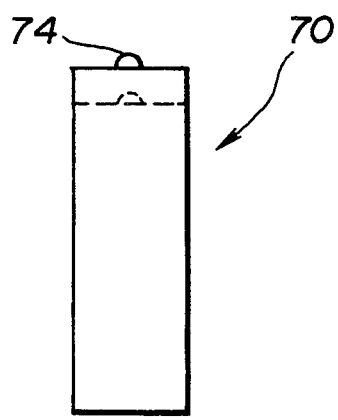

In the above mentioned formation, an alternating voltage is applied to the bending vibration outer electrode 75b and its frequency f is made to coincide with the natural vibration number of the ultrasonic vibrator 70. FIG. 17 shows this bending one-dimensional vibration and FIG. 18 shows the bending two-dimensional vibration. The frequency f of the alternating voltage is made to coincide with such natural vibration number so that the projection 74 of the projecting stand 73 may alternately vibrate in the x direction in FIG. 11. On the other hand, an alternating voltage of a frequency f is applied to the extending and contracting vibration outer electrode 75c so that, as shown in FIG. 19, the extending and contracting vibration may be generated in a non-resonant state. Thereby, the projection 74 of a friction member will alternately vibrate in the z direction in FIG. 11.

Further, by properly adjusting the phases of the voltage applied to the bending vibration outer electrode 75b and extending and contracting vibration outer electrode 75c, the projection 74 can be made to generate a clockwise or counter-clockwise ultrasonic elliptic vibration within the plane x-z. In this state, when a planar driven member is contacted with the projection 74, the driven member will be able to be moved in a positive or negative direction of the x direction.

When an alternating voltage is applied to the bending vibration outer electrode 75d and its frequency f is made to coincide with the natural vibration number of the bending shown in FIG. 17, the projection 74 will alternately vibrate substantially in the y direction in FIG. 11. On the other hand, when an alternating voltage of a frequency f is applied to the extending and contracting vibration outer electrode 75c, such extending and contracting vibration as is shown in FIG. 19 will be generated in a non-resonant state. By this vibration, the projection 74 will be alternately vibrated in the z direction in FIG. 11. When the phase of the voltage applied to the bending vibration outer electrode 75d and extending and contracting vibration outer electrode 75c is properly adjusted, the projection 74 will be able to generate a clockwise or counter-clockwise ultrasonic elliptic vibration within the plane y-z. When a planar driven member not illustrated is pressed into contact with the projection 74, the driven member will be able to be moved in a positive or negative direction of the Y direction.

Further, when a voltage of the same frequency f is applied to the bending vibration outer electrode 75d and extending and contracting vibration outer electrode 75c outer electrode 75a to excite the above mentioned two kinds of vibrations and the sizes of the respective vibrations are varied, such ultrasonic elliptic vibration as includes the z axis in FIG. 11 will be able to be generated. At this time, if a driven member not illustrated is pressed into contact with the projection 74, the driven member will be able to be moved in any direction in the plane x-y.

Figure 20:
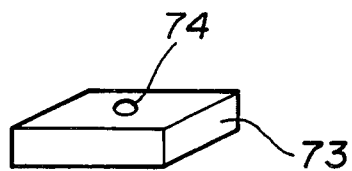
FIG. 20 is a perspective view of a projecting stand of the ultrasonic vibrator in FIG. 11.
Figure 21:
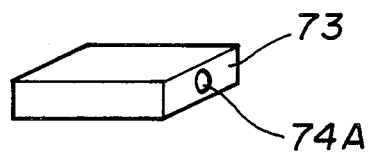
FIGS. 21 and 22 are perspective views respectively showing modifications of the projecting stand of FIG. 20.
Figure 22:
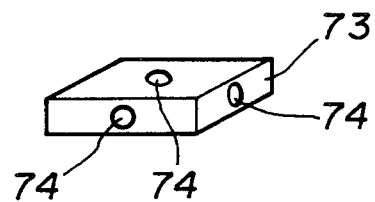

FIGS. 20, 21 and 22 show respective examples of the projecting stand 73. As in FIG. 21, the projection 74A may be provided on the side surface so that the side surface may be a driving surface. As in FIG. 22, the projection 74 may be provided on each surface so that any surface may be used as a driving surface. Also, in this embodiment, the bending vibration is used in a resonant state but may be used in a non-resonant state and the piezo-electric device 71 may be columnar instead of being prismatic. Further, the piezo-electric devices may be jointed by bonding.

Figure 23:
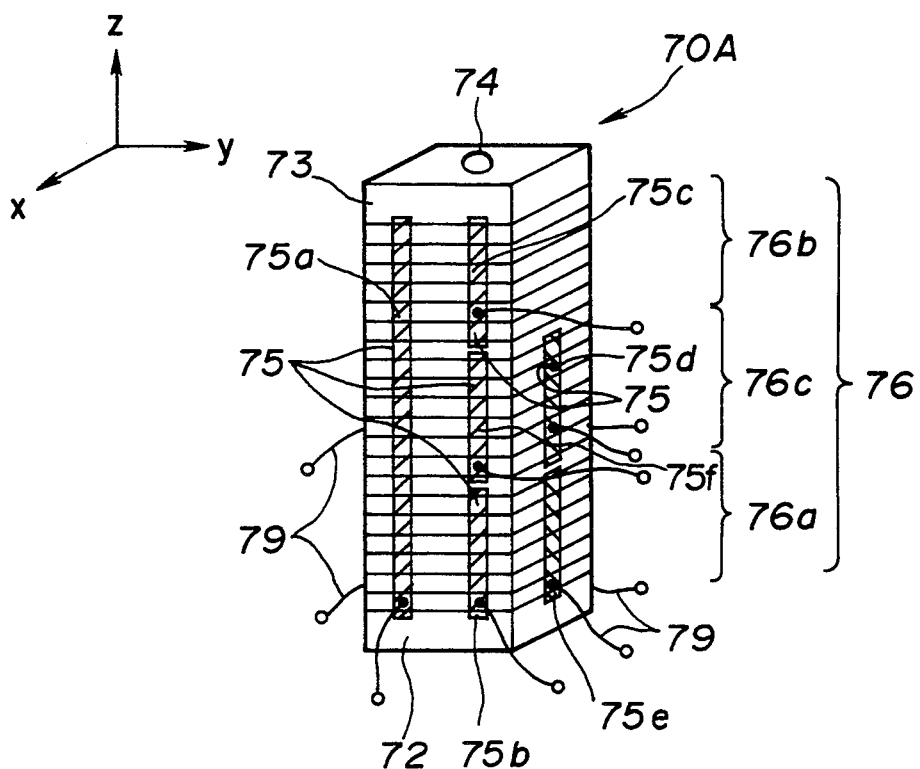
FIG. 23 is a perspective view showing 9 fourth embodiment of an ultrasonic vibrator used for an ultrasonic motor of the present invention.
Figure 24:
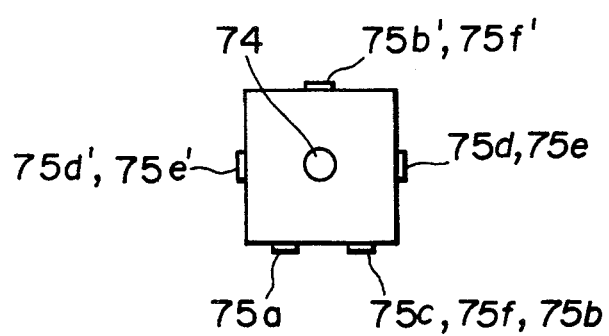
FIG. 24 is a plan view of the vibrator in FIG. 23.

FIGS. 23 and 24 show the fourth embodiment of the present invention. The same elements as in the above mentioned embodiments are represented by the same reference numerals. In an ultrasonic vibrator 70A of this fourth embodiment, the lamination 76c exciting the bending vibration bent in the reverse phase is laminated on the first lamination 76a in the lower part exciting the bending vibration and the second lamination 76b exciting the extending and contracting vibration is laminated on this lamination 76c.

The polarizing process in the above mentioned formation is made as follows. That is to say, a voltage is applied to the two adjacent outer electrodes 75b and 75e of the first lamination 76a and the two outer electrodes 75b' and 75e' of the lamination 76c opposed to these outer electrodes 75b and 75e on the opposite sides so as to be of the same polarity as of the gland outer electrode 75a. Also, a voltage of a polarity reverse to that of the above mentioned electrodes is applied to the remaining outer electrodes 75b and 75e of the first lamination 76a and the remaining outer electrodes 75d and 75f of the lamination 76c. By the way, a voltage of a polarity positive or negative to the gland outer electrode 75a is applied to the outer electrode 75c of the second lamination 76b.

An alternating voltage is applied to the outer electrodes 75b and 75f in the opposed positions and the frequency f is made to coincide with such bending natural vibration as the bending two-dimensional vibration or the bending three-dimensional vibration not illustrated. By this vibration, the projection 74 will be alternately vibrated substantially in the x direction in FIG. 23. Also, an alternating voltage of a frequency f is applied to the outer electrode 75c of the second lamination 76b to generate such extending and contracting vibration as is shown in FIG. 19. By this vibration, the projection 74 will be alternately vibrated in the z direction in FIG. 23. By properly adjusting the phase of the voltage applied to the outer electrodes 75b, 75f and 75c, the projection 74 will be able to generate a clockwise or counter-clockwise ultrasonic elliptic vibration within the plane x-z. In this state, when a planar member not illustrated as a driven member is pressed into contact with the projection 74 as a friction member, the driven member will be able to be moved in a positive or negative x direction.

By the way, the method of generating an ultrasonic elliptic vibration within the plane y-z is the same and shall not be explained.

Therefore, in this fourth embodiment, by varying the sizes of the two kinds of ultrasonic vibrations, in the same manner as in the third embodiment, the driven body can be moved in any direction in the plane x-y.

Figure 25:
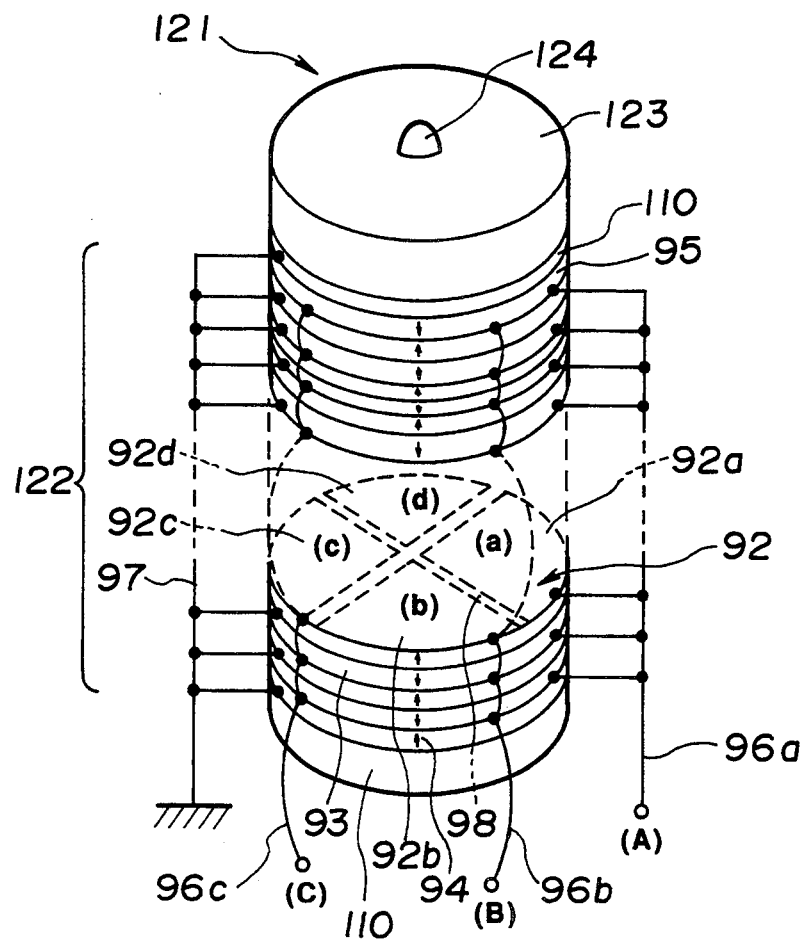
FIG. 25 is a perspective view of a laminated ultrasonic vibrator showing a fifth embodiment of the present invention.

The formation of the fifth embodiment of the present invention shall be explained in the following with reference to FIGS. 25 and 26. FIG. 25 is a perspective view of a laminated ultrasonic vibrator of this embodiment. This vibrator 121 comprises a piezo-electric lamination member 122 made by laminating many piezo-electric ceramics plates 95, unpolarized piezo-electric devices 110 provided at both ends of this piezo-electric lamination member 122 and an upper stand 123 provided on the upper surface of the unpolarized piezo-electric device 110 at the upper end.

In the above mentioned piezo-electric ceramics plates 95, the positive side electrode 92 of the opposed plate-like electrodes consists of divided electrodes 92a to 92d divided in four places, the negative side is a common negative side electrode 93 and the arrow 94 shows the polarizing direction. In the above mentioned piezo-electric lamination member 122, the polarizing directions of the piezo-electric ceramics plates 95 are alternately changed and several to several scores of the plates 95 are laminated by making the slit parts 98 of the electrodes coincide with each other and are bonded with such bonding agent as epoxy resin. The upper stand 123 is a disc made of such metal as stainless steel or such ceramics material as alumina and having a predetermined thickness. This upper stand 123 is bonded to the piezo-electric lamination member 122 on the upper surface and is provided in the central part on the upper surface with a hemispherical projection 124 which is a friction member.

In the piezo-electric ceramics plate 95 forming the piezo-electric lamination member 122, the positive side divided electrodes 92a to 92d and the negative side electrodes 93 of all surface electrodes are commonly connected respectively to every other layer and the lead wire 97 connecting the negative side electrodes 93 and the lead wires 96a, 96b and 96c (the remaining one is not illustrated) connecting respectively the divided electrodes 92a to 92d in the vertical direction are connected to an independent voltage applying apparatus not illustrated.

Figure 26:
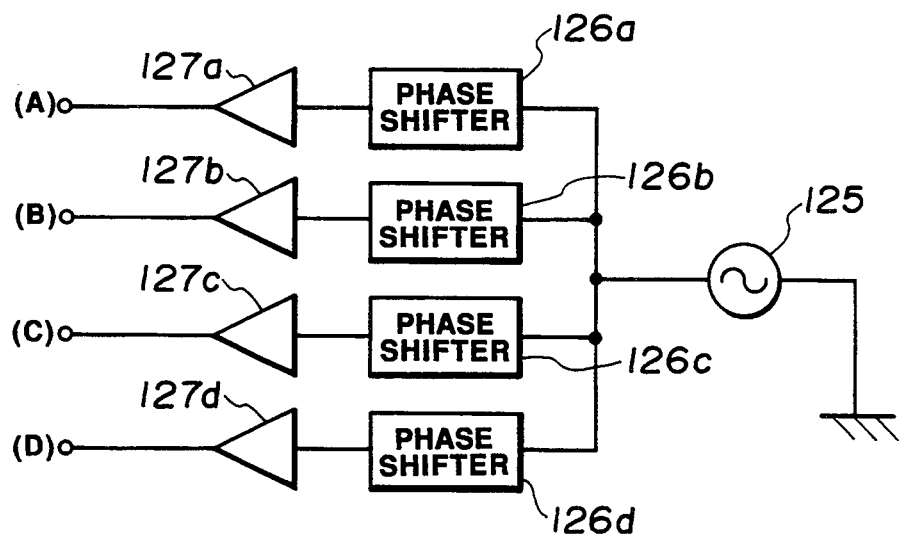
FIG. 26 is an electric circuit diagram showing driving circuits for driving the vibrator of FIG. 25.
Figure 27:
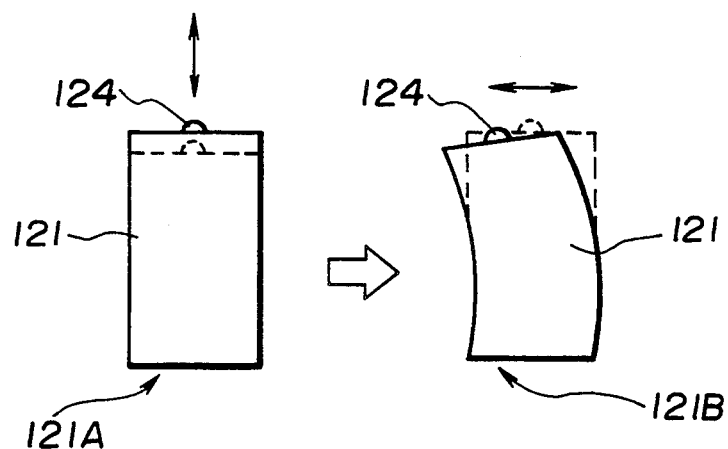
FIGS. 27 and 28 are respectively a side view and plan view showing the vibrator of FIG. 25 as driven.

FIG. 26 shows an example of a driving circuit for driving this vibrator 121. This driving circuit comprises an alternating current power source 125 outputting an alternating current of a frequency f, phase shifters 126a to 126d and electric power amplifiers 127a to 127d amplifying the alternating currents from the phase shifters 126a to 126d.

The operation by the above mentioned formation shall be explained with reference to FIGS. 27 to 30. When an alternating current voltage is simultaneously applied to the divided electrodes 92a to 92d of the above mentioned laminated ultrasonic vibrator 121, the vibrator 121 will vibrate in the vertical direction as in 121A in FIG. 27. On the other hand, the vibration in the horizontal direction will be determined by the size of the voltage applied to the respective divided electrodes 92a to 92d and will vibrate as in 121B. The size and direction of the vibration can be controlled by the applied voltage and applying electrode position. In FIG. 28, 121C to 121F representing the positive side electrode 92 surfaces of the piezo-electric ceramics plates 95 illustrate the electrode parts applying the voltage and the directions of the displacements.

121C means that a positive voltage is applied to the electrode part of (a) and a negative voltage is applied to the electrode part of (c) located in a position symmetric to the point of (a). The arrow P shows the direction of the displacement at that time. In the same manner, 121D is a state view showing the displacing direction when a positive voltage is applied to (b) and a negative voltage is applied to (d), 121E is a state view showing the displacing direction when an equal positive voltage [(a)=(d)]is applied to (a) and (d) and an equal negative voltage is applied to (b) and (c) and further 121F is a state view showing the displacing direction when a positive voltage is applied to (a) and (d) but the voltage applied to (a) is higher than the voltage applied to (d) [(a)>(d)]and, in the same manner, a negative voltage is applied to (c) and (b) but the negative voltage applied to (c) is larger than that applied to (b). The vibration is generated by applying an alternating current voltage, the vibrating direction is determined by the applying electrode part and the size of the vibration is determined by the size of the applied voltage.

Figure 29:
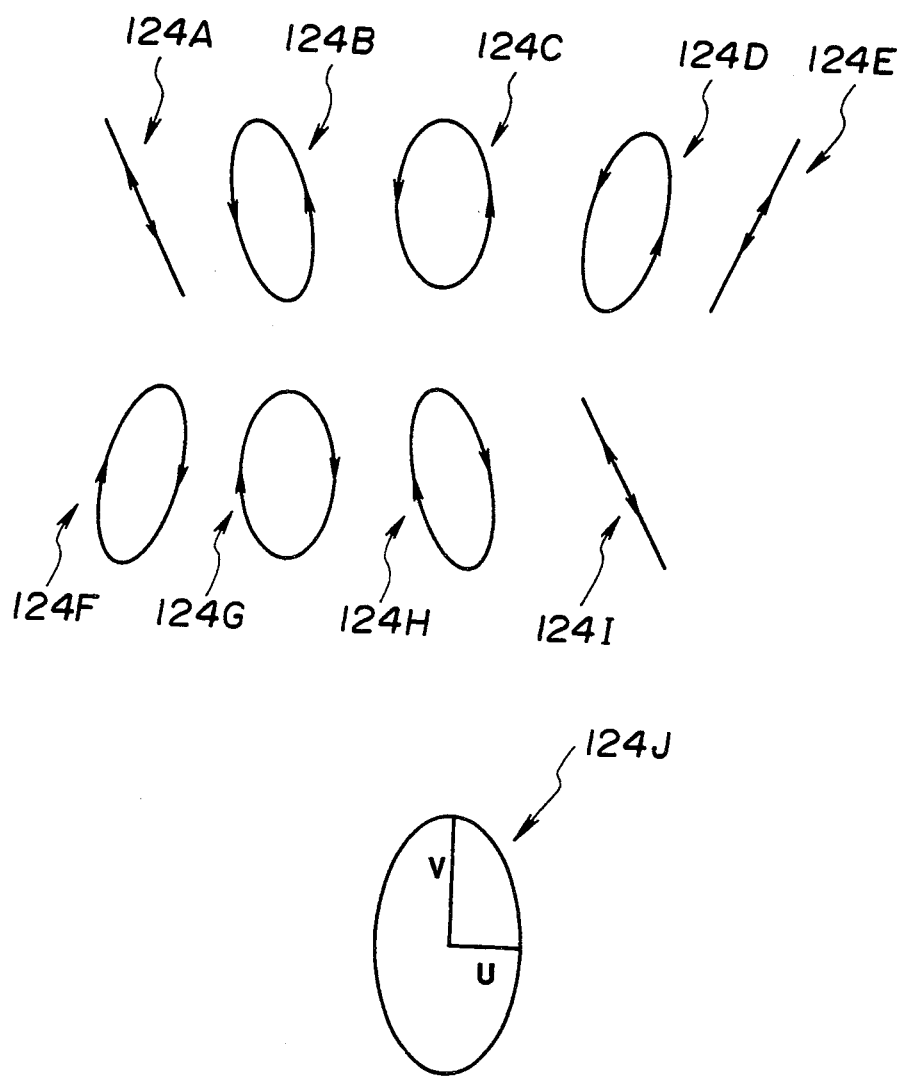
FIG. 29 is a plan view showing vibration foci when the vibrator in FIG. 27 is driven.

When the above mentioned two vibrations are simultaneously excited, the projection 124 controlling the phase shift will describe such various vibration loci of 124A to 124I as are shown in FIG. 29. In order to use this vibrator as a linear motor, the elliptic loci of 124C and 124G may be obtained. The sizes of the components v and u of the elliptic locus shown in 124J in FIG. 29 can be varied by varying the amplifying rates of the respective electric power amplifiers 127a to 127d (See FIG. 26).

Figure 31:
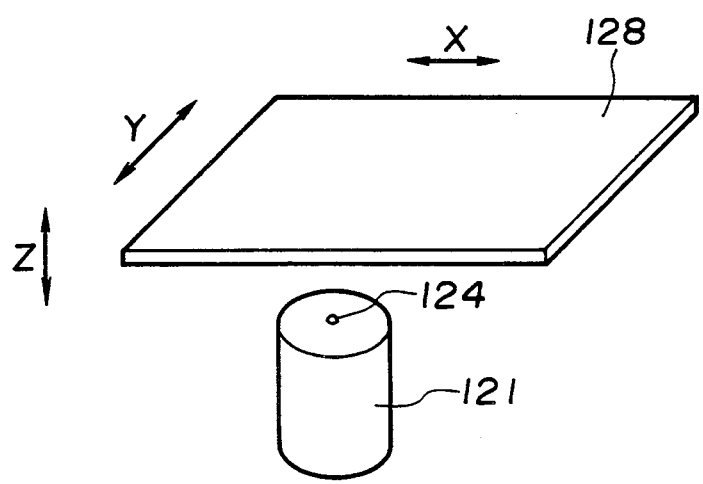
FIGS. 31 and 32 are schematic perspective views showing a driving apparatus using the vibrator FIG. 25.
Figure 32:
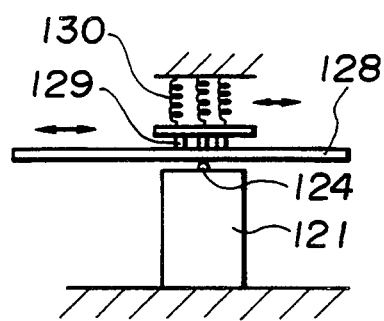

FIGS. 31 and 32 are views showing the formation of a driving apparatus using the above described laminated ultrasonic vibrator 121. FIG. 31 is a perspective view showing the vibrator 121 and slider 128. FIG. 32 is a sectioned view of an example in which the slider 128 is contacted with the projection 124 of the vibrator 121 by a fixed pressing force. In this case, a pressing mechanism provided with a bearing 129 and springs 130 as shown in FIG. 32 is used as a means of pressing the above mentioned slider 128 against the projection 124 with a fixed force.

Figure 28:
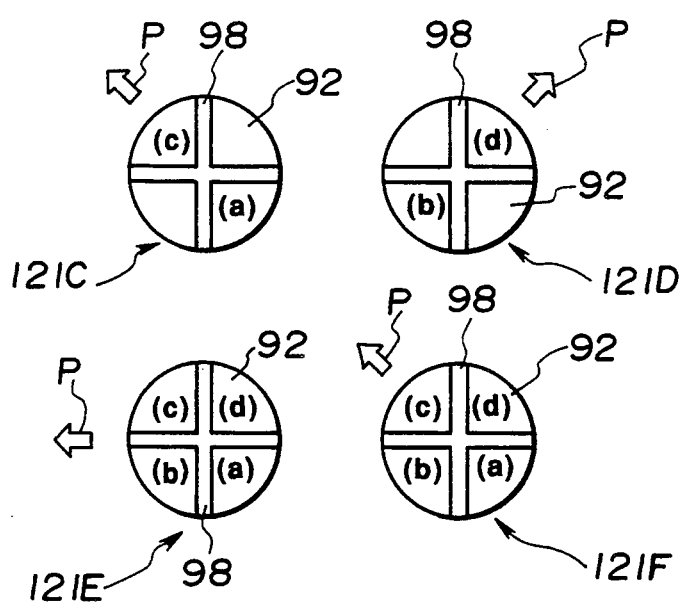
Figure 30:
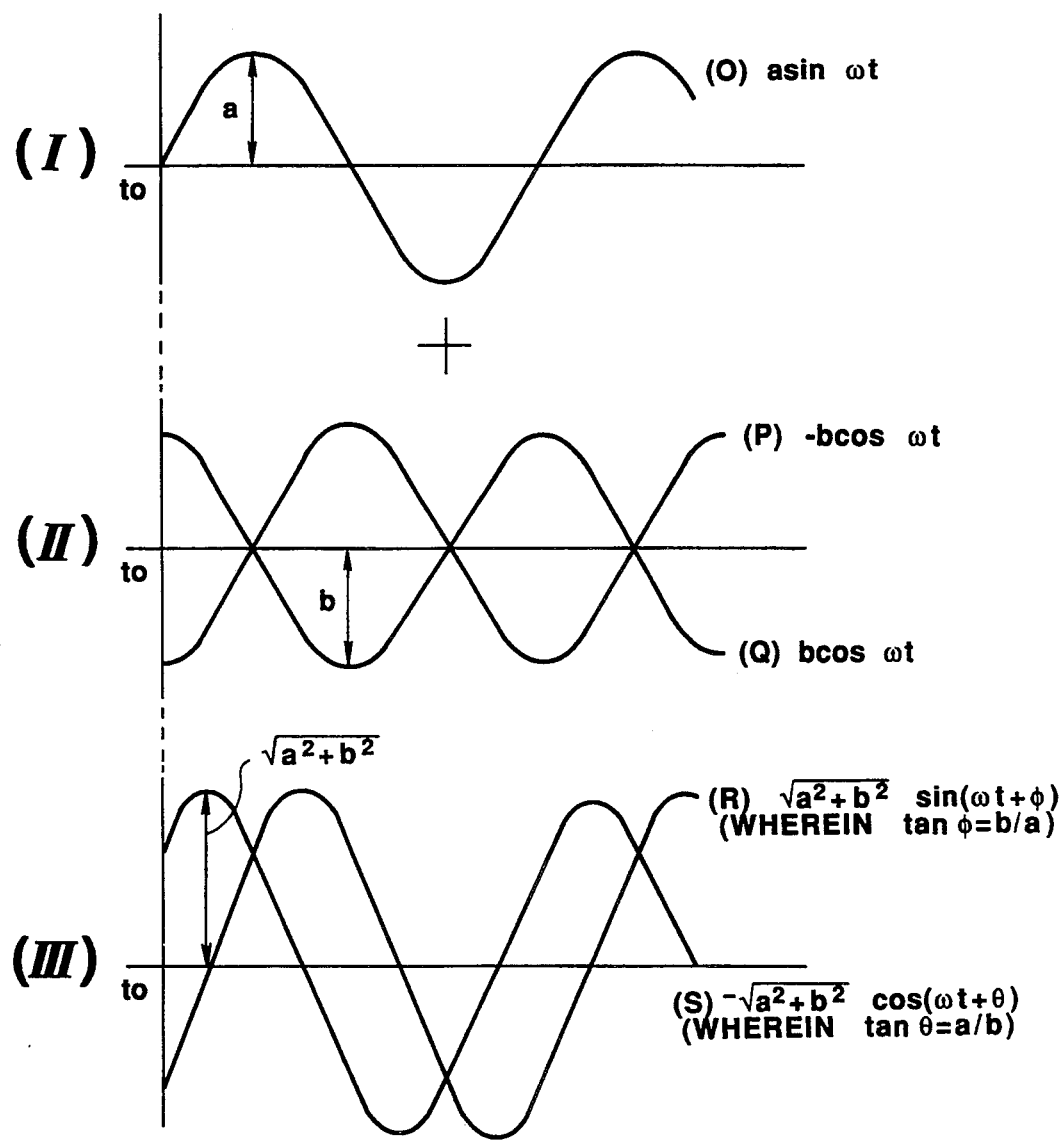
FIG. 30 are waveform diagrams showing voltage applying methods of for the vibrator of FIG. 25.

A concrete voltage applying method generating an elliptic vibration in the vibrator 121 of this driving apparatus shall be explained in the following. The voltage applying method in the case of moving the movable member in the direction of the arrow P in 121C in FIG. 28 is as follows. The elliptic vibration is obtained by synthesizing the vibrations in the horizontal direction and vertical direction. An example of the method of moving the driven member in the direction of the arrow P in 121C in FIG. 28 shall be explained by using FIG. 30. In order to obtain a vibration in the horizontal direction, no voltage is applied to the electrode parts of (b) and (d), a voltage of b cos ω t as Q in (II) in FIG. 30 is applied to the (a) part and a voltage of −b cos ω t of P is applied to (c). In order to obtain a vertical vibration, the same voltage may be applied to all the electrode parts. If this is such voltage of a sin ω t as is shown, for example, in (I) in FIG. 30, in order to obtain an elliptic vibration, they may be added together and the voltages to be applied to (a) to (d) will be respectively as in the following formulae 1 to 4 in which tan Φ=b/a and tan θ=a/b:

$$\sqrt{a^2 + b^2} \sin(\omega t + \Phi) \quad 1$$

$$a \sin \omega t \quad 2$$

$$\sqrt{a^2 + b^2} \cos(\omega t + \theta) \quad 3$$

$$a \sin \omega t \quad 4$$

If the voltage is applied as mentioned above, the vibrator 121 will make an elliptic vibration and the driven member will move in the arrow P direction in 121C in FIG. 28. As the movement in the arrow P direction in 121E and 121F in FIG. 28 is freely obtained by controlling the voltage ratios of (a):(d) and (b):(c), the vibration in the horizontal direction can be moved in any direction by combining it with the vibration in the vertical direction by the same idea as in 121C.

When the vibrator 121 of this embodiment is used, a two-dimensional linear motor compact in shape, not regulated in the power source frequency or the like and easy to design will be able to be made.

Figure 33:
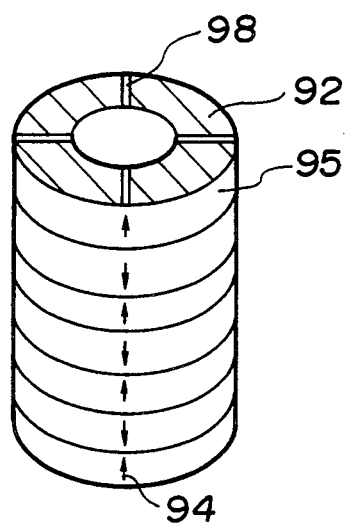
FIGS. 33 to 35 are perspective views showing modifications of the vibrator of FIG. 25.
Figure 34:
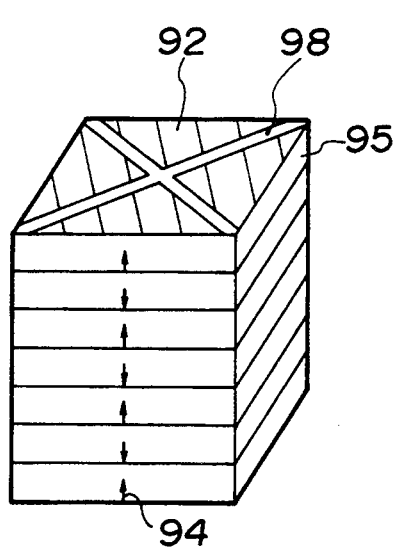
Figure 35:
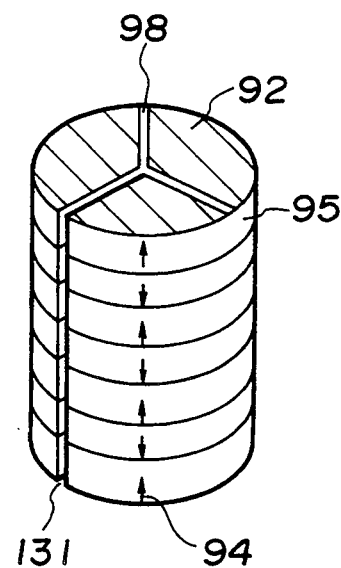

In this embodiment, a columnar electrode divided into four parts is exemplified but, the same as is explained in the above mentioned embodiments, as shown in FIGS. 33 to 35, even with a ring-like or polygonal pillar-like laminated vibrating device with a positive side electrode 92 divided into two or more parts, the same effects will be obtained. Also, in this embodiment, the piezo-electric ceramics plates 95 are laminated and bonded to make the vibrator 121 but, if incisions 131 are provided as in FIG. 35, the positioning in bonding will be easy. Also, even if green sheets are printed with inner electrodes, laminated and cut to make the vibrator 121, the same effects will be shown. Further, the negative side electrode 93 is made a common electrode but, even if it is made a divided electrode, the effects will not be different.

Figure 36:
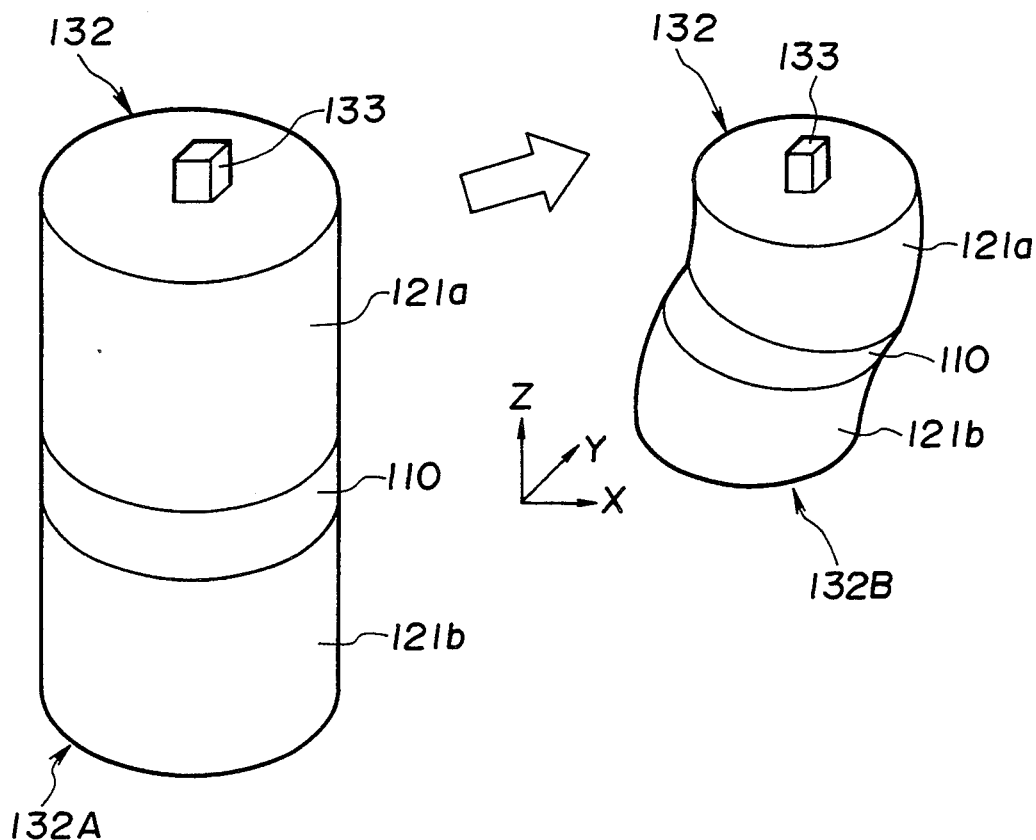
FIG. 36 is a perspective view of an ultrasonic vibrator moving parallelly with a reference plane showing a sixth embodiment of the present invention.
Figure 37:
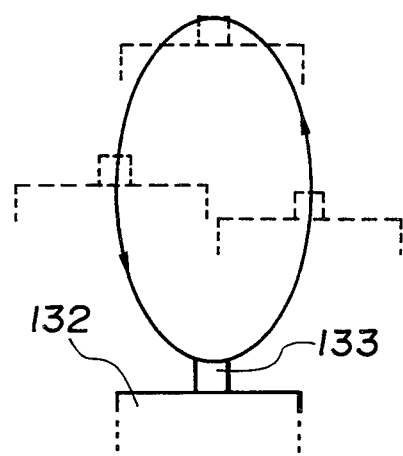
FIG. 37 is a diagram showing a vibration locus of the vibrator in FIG. 36.

FIGS. 36 and 37 show the sixth embodiment of the present invention. 132A in FIG. 36 is a perspective view of an ultrasonic vibrator 132 moving parallelly with a reference plane and 132B shows an example of the same vibrator 132 in driving. FIG. 37 is a state view of a vibration locus. By the way, the same components as in the above mentioned embodiments shall bear the same reference numerals and only the differences from the above mentioned embodiment shall be explained. The ultrasonic vibrator 132 moving parallelly with a reference plane in 132A is a vibrator wherein a rectangular parallelepipedal projection 133 as a friction member is fitted to the formation of an unpolarized piezo-electric device 110 held between two laminated ultrasonic vibrators 121a and 121b having divided electrodes not illustrated the same as in the above mentioned embodiments. In the same manner as in the above mentioned embodiments, the electrodes corresponding in the vertical direction of the respective piezo-electric laminated members 122 are connected with themselves and are further connected to a voltage applying apparatus not illustrated.

In the vibrator 132 in FIG. 36, when a voltage of the same phase is applied to the symmetric electrode positions of the two laminated ultrasonic vibrators 121a and 121b by an independent voltage applying apparatus not illustrated, the upper surface of the rectangular parallelepipedal projection 133 will be always parallel with the x-y plane. 132B shows an example in driving. FIG. 37 is a view showing a locus of the vibration and the state of the upper part of the vibrator. The unpolarized piezo-electric device 110 is added to the vibrator 132 to reduce the strain in transforming and to elongate the life, has an action of expanding the vibration in the x-y direction and operates with or without a half polarized article.

Thus in this embodiment, as different from the conventional ultrasonic linear motor, as there is no rotary component in the projection 133 as a friction member, the shape of the projection 133 need not be made hemispherical or the like and, whereas the contact with the driven member has been a point contact, in the vibrator 132 in this embodiment, as the columnar or polygonal pillar-like projection 133 is used, the contact is a plane contact. Also, even if the projection 133 is not used, the upper surface part of the upper stand 123 will be able to be made a contact plane with the driven member. With the plane contact, the wear of the driven member and projection 133 will reduce, the durability will rise, the slip will reduce and therefore a motor having a high positioning precision will be able to be easily made.

Also, in the ultrasonic vibrator 132 moving parallelly with a reference plane wherein vibrators of the same shape are rotated by 180° degrees and are arranged in series with two laminated ultrasonic vibrators 121a and 121b, when the electrodes in the positions symmetric by 180° degrees above and below are connected with each other, a displacement having no rotary component will be able to be obtained with a minimum voltage applying apparatus.

Figure 38:
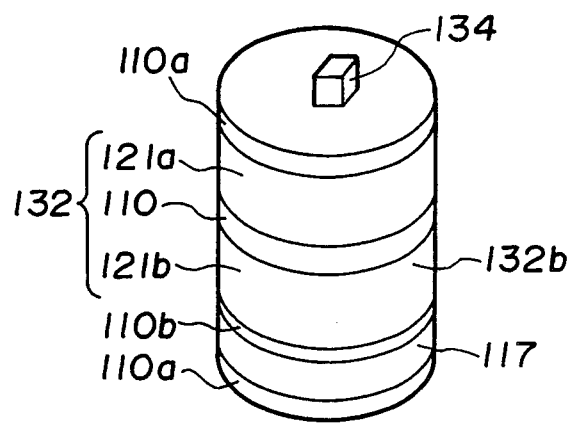
FIG. 38 is a perspective view of an ultrasonic vibrator moving parallelly with a reference plane showing a seventh embodiment of the present invention.
Figure 39:
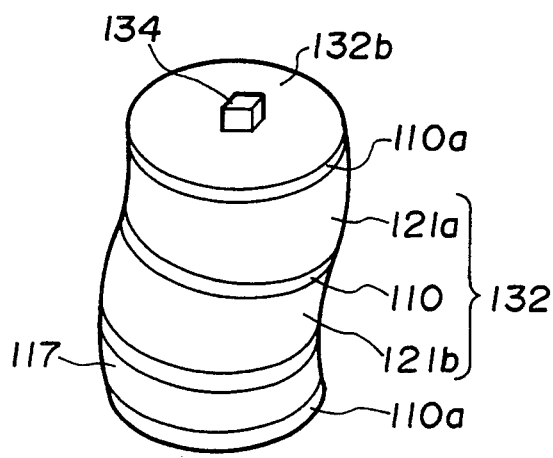
FIG. 39 is a perspective view of the vibrator in FIG. 38 as driven.

FIGS. 38 and 39 show the formation of the seventh embodiment of the present invention. FIG. 38 shows a perspective view of an ultrasonic vibrator 132b moving parallelly with a reference plane. It is an ultrasonic vibrator moving parallelly with a reference plane wherein the unpolarized piezo-electric devices 110a and 110b and a general laminated one-dimensional vibrating device 117 in which all the opposed electrodes of piezoelectric ceramics plates are made all surface electrodes are arranged in series with the ultrasonic vibrator 132 moving parallelly with a reference plane of the above mentioned embodiment and are connected to an independent voltage applying apparatus not illustrated.

Figure 40:
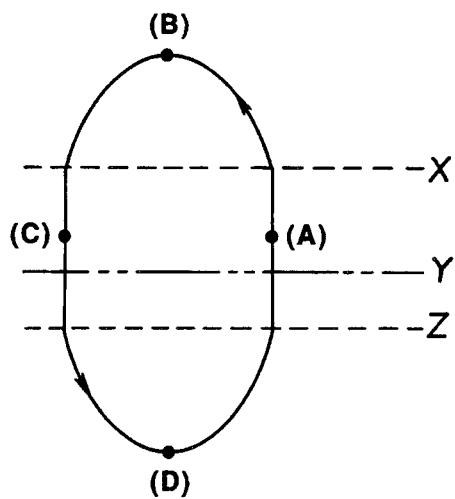
FIG. 40 is a diagram showing a vibration locus of the vibrator in FIG. 38.

An example of the vibrator 132b of the above mentioned formation as driven is shown in FIG. 39. By the laminated ultrasonic vibrators 121a and 121b and the unpolarized piezo-electric device 110b, the same as in the above mentioned embodiments, the upper surface of the projection 134 will elliptically vibrate while kept always parallel with the fitting surface (not illustrated) of this vibrator 132b. When a voltage is applied to the laminated one-dimensional vibrating device 117 during this elliptic vibration, the projection 134 will describe a locus of an elliptic vibration having such linear motion part (X-Z) as is shown in FIG. 40. When the projection 134 is made to contact with the slider 128 at a height above Y, in this vibrator 132b, at the time of the motion of only the component in the vertical direction, the projection will begin to surface-contact with the driven member and will separate again. Therefore, the driven member will not slip sidewise. Therefore, the driving apparatus of this embodiment has no conventional problem that the displacement amount is delicately different depending on the weight applied to the projection 134. FIG. 41 is a view showing the slider 128 as being moved by the vibrator 132b of this embodiment. (A) to (D) coincide with the reference numeral positions in FIG. 40. By the way, the unpolarized piezo-electric devices 110a are laminated on both side surfaces of the vibrator 132b to operate to reduce the strain the same as in the third embodiment.

The vibrator 132b of this embodiment is different from the conventional ultrasonic linear motor, has linear parts in the vibration locus and therefore has no slip and a high precision linear motor can be made. Also, the wear of the driven member and projection 134 will reduce and a clean motor high in the durability will be able to be made.

What is claimed is:

1. A two-dimensional driving ultrasonic motor characterized by comprising:
   a first electro-mechanical energy converting device having opposing surfaces and being uniformly polarized in a given direction and having electrodes substantially covering both opposing surfaces;
   a second electro-mechanical energy converting device laminated to said first electro-mechanical energy converting device, having opposing surfaces and being uniformly polarized in a given direction and having an electrode substantially covering one of said opposing surfaces and a divided electrode arranged on the other surface, said divided electrode having electrode portions being separated from one another along a first dividing line;
   a third electro-mechanical energy converting device having opposing surfaces and being laminated to one of said first and second electro-mechanical energy converting devices, and being uniformly polarized in a given direction and having an electrode substantially covering one of said opposing surfaces and a divided electrode arranged on another one of the opposing surfaces, said divided electrode comprising electrode portions being separated along a second dividing line, said second and third devices being aligned so that said first and second dividing lines intersect substantially at right angles;
   a friction member fixed to an end of said laminated electro-mechanical energy converting devices;
   means for pressing a driven member against said friction member under a predetermined pressure; and
   means for applying operating signals to said first, second and third devices including means for controlling amplitude and phase of the operating signals to obtain a desired two-dimensional output.

2. A two-dimensional driving ultrasonic motor according to claim 1 characterized in that an elastic body is further laminated on said laminated electro-mechanical energy converting device and friction member.

3. A two-dimensional driving ultrasonic motor according to claim 1 characterized in that a vertical vibration in the laminating direction is generated by said first electro-mechanical energy converting device, a horizontal vibration intersecting substantially at right angles with said vertical vibration is generated by one of said second and third electro-mechanical energy converting device and these vibrations are synthesized to drive said driven member by said means for applying operating signals.

4. A two-dimensional driving ultrasonic motor according to claim 1 wherein the surfaces of said second and third devices having said divided electrodes are joined to one another.

5. A two-dimensional driving ultrasonic motor according to claim 1 wherein said divided electrode comprises more than two electrodes.

6. A two-dimensional driving ultrasonic motor according to claim 5 wherein said divided electrode comprises three electrodes.

7. A two-dimensional driving ultrasonic motor according to claim 5 wherein said divided electrode comprises four electrodes.

8. A two-dimensional driving ultrasonic motor characterized by comprising:
   first and second ultrasonic vibrators each being comprised of:
   a first electro-mechanical energy converting device being uniformly polarized in a given direction;
   second and third electro-mechanical energy converting devices laminated to said first electro-mechanical energy converting device, each having first and second portions uniformly polarized in opposite directions, said first and second portions being separated by a linear dividing line;
   said second and third devices being aligned so that their respective dividing lines are arranged substantially at right angles;
   an end of said first ultrasonic vibrator being joined to an end of said second ultrasonic vibrator;
   a friction member fixed to an end of one of said first and second ultrasonic vibrators;

means pressing a driven member against said friction member; and means for applying operating signals to said devices to obtain a two-dimensional output.

9. A two-dimensional driving ultrasonic motor according to claim 8 further comprising an elastic body arranged between said first and second ultrasonic vibrators.

10. A two-dimensional driving ultrasonic motor characterized by comprising:

a first electro-mechanical energy converting device uniformly polarized in a given direction;

second and third electro-mechanical energy converting devices each having first and second portions uniformly polarized in opposing directions, said first and second uniformly polarized portions arranged on opposite sides of a linear dividing line;

said second electro-mechanical energy converting device being laminated to said first electro-mechanical energy converting device;

said third electro-mechanical energy converting device being laminated to one of said first and second electro-mechanical energy converting devices;

the orientation of said second and third electro-mechanical energy devices being such that the linear dividing lines separating their uniformly polarized sections of opposing polarity are oriented at right angles relative to one another;

a friction member fixed to an end of one of said electro-mechanical energy converting devices; and means for pressing a driven member against said friction member under a predetermined pressure.

11. A two-dimensional driving ultrasonic motor according to claim 10 characterized in that an elastic body is further laminated on said laminated electro-mechanical energy converting device and friction member.

12. A two-dimensional driving ultrasonic motor according to claim 10 characterized in that a vertical vibration in the laminating direction is generated by said first electro-mechanical energy converting device, a horizontal vibration in a direction substantially at right angles with said vertical vibration is generated by one of said second and third electro-mechanical energy converting device and these vibrations are synthesized by said driving means coupled to said ultrasonic motor to drive said driven member.

13. A two-dimensional driving ultrasonic motor according to claim 11 characterized in that a vertical vibration in the laminating direction is generated by said first electro-mechanical energy converting device, a horizontal vibration intersecting substantially at right angles with said vertical vibration is generated by one of said second and third electro-chemical energy converting devices and these vibrations are synthesized to drive said driven member by means for applying driving signals to said energy converting devices.

14. A two-dimensional driving ultrasonic motor according to claim 10 further comprising an elastic body mounted to at least one end of said motor.

15. A two-dimensional driving ultrasonic motor according to claim 14 wherein said elastic body is formed of a metallic material.

16. A two-dimensional driving ultrasonic motor according to claim 10 further comprising an insulator arranged between and laminated to said first and second devices.

17. A two-dimensional driving ultrasonic motor according to claim 10 wherein said friction member is mounted upon an elastic body joined to said end of said laminated devices.

18. A two-dimensional driving ultrasonic motor according to claim 17 wherein said elastic body is formed of a metallic material.

19. A two-dimensional driving ultrasonic motor according to claim 18 further comprising an insulator for insulating said metallic body from said device.

20. A two-dimensional driving ultrasonic motor according to claim 10 further comprising:

an alternating power source and phase shifter means for coupling said power source to the electrodes of said first, second and third devices;

said phase shifter means being coupled between said power source and electrodes of said first, second and third electro-mechanical devices for shifting a phase of an applied signal according to a desired driving pattern.

* * * * *